United States Patent [19]

Dooley

[11] Patent Number: 5,213,950
[45] Date of Patent: May 25, 1993

[54] PRE-BAKE PRINTING PLATE COMPOSITION

[75] Inventor: Thomas J. Dooley, Teaneck, N.J.

[73] Assignee: Sun Chemical Corporation, Fort Lee, N.J.

[21] Appl. No.: 929,655

[22] Filed: Aug. 12, 1992

Related U.S. Application Data

[62] Division of Ser. No. 647,909, Jan. 30, 1991.

[51] Int. Cl.$^5$ .............................................. G03F 7/40
[52] U.S. Cl. .................................. 430/309; 430/302; 430/330; 430/331; 101/463.1
[58] Field of Search ............... 430/309, 331, 302, 330; 101/463.1, 465, 466, 467

[56] References Cited

U.S. PATENT DOCUMENTS

| | | | |
|---|---|---|---|
| 3,669,660 | 6/1972 | Golda et al. | 430/331 |
| 4,277,555 | 7/1981 | Fromson et al. | 430/278 |
| 4,294,910 | 10/1981 | Wielinga | 430/302 |
| 4,391,897 | 7/1983 | Gracia et al. | 430/331 |
| 4,762,771 | 8/1988 | Matsumoto et al. | 430/309 |
| 4,786,581 | 11/1988 | Stahlhofen et al. | 430/331 |
| 4,885,230 | 12/1989 | Stahlhofen et al. | 430/309 |
| 5,021,324 | 6/1991 | Jargiello et al. | 430/331 |
| 5,168,813 | 12/1992 | Riley et al. | 101/463.1 |

FOREIGN PATENT DOCUMENTS

WO90/0375 4/1990 PCT Int'l Appl. ................. 430/309

Primary Examiner—Marion E. McCamish
Assistant Examiner—Janis L. Dote
Attorney, Agent, or Firm—Jack Matalon

[57] ABSTRACT

An aqueous composition useful for the protection of actinic light-exposed presensitized lithographic printing plates. The composition comprises an effective amount of (a) an ammonium, sodium, potassium or lithium salt of a strong organic acid, and (b) an ammonium, sodium, potassium or lithium salt of an anionic surfactant which contains functionalities of the salt of a strong organic acid and the salt of a weak organic acid, and (c) an ammonium, sodium, potassium or lithium salt of a weak organic acid. The composition is applied to the surface of the plates after they have been developed, but before they have been baked, thereby preventing surface contamination that would otherwise occur from the heat treatment.

8 Claims, No Drawings

PRE-BAKE PRINTING PLATE COMPOSITION

This is a divisional of copending application Ser. No. 07/647,909 filed on Jan. 30, 1991.

FIELD OF THE INVENTION

This invention relates to a pre-bake printing plate composition comprising an effective amount of a salt of a strong organic acid and a salt of a weak organic acid dissolved in water. The composition is useful for protecting the surface of actinic light-exposed presensitized lithographic printing plates, when applied to the surface of the plates after they have been developed but before they have been baked, thereby preventing surface contamination resulting from the heat treatment. The composition is of particular significance in that it provides a wider latitude of application than prior art compositions currently in use.

BACKGROUND OF THE INVENTION

Radiation sensitive plates suitable for lithographic printing are well known. Such plates typically consist of a substrate such as aluminum that may be grained and/or anodized, or of zinc, magnesium, copper or steel or a combination such as a bimetal or laminate, and a layer of radiation sensitive material deposited on the substrate.

Image-wise exposing the radiation sensitive layer to actinic radiation through a transparency causes the solubility of the radiation-exposed areas to change relative to that of the unexposed areas. Upon treatment of the exposed plate with a suitable developer, the more soluble areas can be readily removed to reveal the underlying substrate and leave an image on the substrate constituted by the less soluble areas. The areas of the substrate revealed upon development constitute the non-image areas.

A type of radiation sensitive materials known as photopolymers become less soluble after exposure to radiation and therefore a negative transparency is used in the exposure. In this case, it is the non-radiation-exposed areas that are removed upon development and the radiation-exposed areas that remain on the substrate form the image. Examples of suitable photopolymers include diazo resins chromium-sensitized colloids, diazonium or azide-sensitized resins or polymers bearing such groups. Plates having a radiation sensitive layer based on such materials are known as negative-working plates.

Radiation sensitive materials such as those based on orthoquinone diazides become more soluble after exposure to radiation and therefore a positive transparency is used in the exposure. In this case, it is the radiation-exposed areas that are removed by development and the non-radiation-exposed areas that remain on the substrate form the image. Plates having such radiation sensitive layers are known as positive-working plates.

The life, in terms of the number of copies it can produce, of a printing plate can often be increased by baking the plates, i.e. "burning-in" the image areas, provided, of course, the material of the image areas is suitable. "Burning-in" is a well-established practice in the art of producing lithographic printing plates from radiation-sensitive plates ("burning-in" is most commonly carried out with positive-working plates). The "burning-in" causes extensive crosslinking to occur in the polymeric structure of the material comprising the image area. The limiting temperature and time of the "burning-in" is that at which the aluminum anneals, resulting in a loss of strength required for a printing plate.

U.K. Patent 669,412 discloses the burning-in of images based on naphthoquinone diazides. In accordance with the teachings of this patent, a radiation sensitive plate including a layer of the diazide is image-wise exposed, developed with an alkaline solution to remove selectively those areas of the layer exposed to radiation, and then placed in an oven to heat the image constituted by those areas of the layer that were not exposed to radiation. Thereafter, it is necessary to treat the plate with an alkaline solution again in order to remove contaminating residues from the plate and make the plate ready for printing.

In many cases, the image areas to be heated may be reinforced by incorporating reinforcing material in the radiation sensitive layer and/or by applying the reinforcing material in the form of a reinforcing lacquer to the image areas after development. Novolak resins and/or resol resins are examples of commonly used reinforcing materials. However, as disclosed in U.K. Patent 1,154,749, heating at a temperature sufficient to harden resin-reinforced image areas causes those areas of the substrate revealed on development to be at least partially covered with a contaminating layer which is ink accepting and which would therefore cause scumming and yield a soiled background during printing. This layer must therefore be removed before printing is initiated and this is achieved in accordance with the teachings of the patent by treating the plate with aqueous alkaline solution.

U.S. Pat. No. 4,294,910 discloses the use of various aqueous compositions known as "gumming" or "pre-bake" solutions to avoid problems resulting from the burning-in process. Such solutions contain materials such as sodium dodecyl phenoxybenzene disulfonate and the sodium salts of alkylated naphthalene sulfonic acid, sulfonated alkyl diphenyl oxide, methylene dinaphthalene disulfonic acid, etc.

U.S. Pat. No. 4,786,581 discloses the use of "gumming" solutions for protecting plates during the burning-in process; these aqueous solutions contain a hydrophilic polymer component and an organic acid component. The organic acid component (or water-soluble salt thereof) contains di- or greater acid functionality and encompasses the benzene carboxylic acids, sulfonic acids and phosphonic acids including alkane phosphonic acids. In contradistinction to the materials recited in the '581 patent, the present invention does not require the use of a hydrophilic polymer. U.S. Pat. No. 4,885,230 discloses the use of water-soluble homopolymers and copolymers of monomers such as styrene sulfonic acid, vinyl phosphonic acid, etc. and water-soluble salts thereof. However, the compositions disclosed in this patent do not include polymers containing strong acid functionalities and their salts.

The contaminating layer produced as the result of the burning-in process is not, as a rule, discernible to the naked eye and it is difficult to ensure that all the contamination has been removed. Moreover, in the case of those substrate surfaces that are porous, as is the case of an anodized aluminum plate, contamination may be present in the pores as a result of residual material left behind from the development process. Such contamination is likely to even cause scumming during long printing runs as the substrate surface is gradually worn away.

The alternative of redeveloping the plates after burning-in in order to remove the contaminating layer is costly and inconvenient since the plates have to be returned to the plate fabrication facility after they have been removed from the oven.

In view of the difficulties associated with the removal of the contamination which is produced by the burning-in procedure, it is desirable to prevent such contamination from occurring in the first instance. Also, it has been found that the contamination apparently arises as a result of some component of the image material subliming from the image areas during heating and subsequently being redeposited on the areas of the substrate revealed on development. Even plates that contain no substances that could generate contamination during heating nevertheless have become contaminated by deposition of contaminating material previously deposited on the internal surfaces of the burning-in oven as a result of prior usage. Thus, an effective pre-bake gum formulation is essential for success in the burning-in process.

It is important to consider the requirements for an effective pre-bake gum solution. The components of the solution must act to clean or even seal the porous aluminum oxide surface. Indeed, such cleaning must occur with precision around the fine image structure of the printing plate. On the other hand, the components of the pre-bake gum must also not attack the coating that constitutes the image area. Such components must not only avoid penetration to the base or near to the base, but must also avoid the creation of serious irregularities in the coating surface. Deficiencies occurring during the pre-bake process can bring about coating failure under the stress of press conditions.

The aqueous composition of the present invention provides superior pre-bake protection while allowing for a wide latitude of coating thickness. The superior properties in comparison to the prior art compositions arise out of a better coating integrity during lay-down on the plate surface as well as during pyrolysis (i.e. during "burning-in"). Furthermore, the anionic surfactant component of the composition of this invention has a viscosity depressant property and also has a unique wetting activity that increases markedly (i.e. 10–30 fold) with temperature.

DETAILS OF THE PRESENT INVENTION

The present invention involves the use of an aqueous composition which is applied to the surface of the developed plate prior to burning-in. The composition acts as a protectant in preventing contamination from occurring during burning-in and thereby obviates the necessity for redeveloping the plate. The unique improvement of the invention lies in an increase in the latitude of application, i.e. in the permitted variation in coating thickness, such as occurs in the manual application of the pre-bake gum solution.

The aqueous composition comprises an effective amount of (a) an ammonium, sodium, potassium or lithium salt of a strong organic acid, and (b) an ammonium, sodium, potassium or lithium salt of an anionic surfactant which contains functionalities of the salt of a strong organic acid and the salt of a weak organic acid, and (c) an ammonium, sodium, potassium or lithium salt of a weak organic acid. The cation need not be the same for the strong organic acid salt, the anionic surfactant and the weak organic acid salt. Indeed, it is preferred that the composition contain a combination of potassium and sodium salts. Preferably, the strong organic acid and the weak organic acid salts are employed in their potassium forms, while the anionic surfactant is preferably employed in its sodium form. This will result in a composition in which the potassium:sodium molar ratio will range from 1:1 to 15:1, preferably 2:1 to 8:1.

The potassium-sodium salt combination is preferred for several reasons. First, it results in a marked color change to brown when the plated is baked. This color change is helpful to the printer since it offers an immediate indication as to whether the plate has been baked. It has also been found that the combination of potassium and sodium salts causes a retention of film integrity during drying and pyrolysis (i.e. the baking or "burning-in" step). The result is a smooth, unmarked plate coating surface after baking and washing. When the salts were exclusively sodium, tiny cracks occurred in the film during drying and baking, resulting in areas having a linear wave-like surface pattern, which indicated a coating attack.

The strong organic acid may contain $C_8$–$C_{40}$ straight or branched chain alkyl, alkaryl, aralkyl, aryl or aryl ether groups and includes acids such as n-decyl (sulfophenoxy) benzenesulfonic acid, oxybis (n-decylbenzenesulfonic acid), a mono-or di-alkyl straight or branched chain derivative of naphthalenesulfonic acid having 1 to 4 carbon atoms in the alkyl group, methylene dinaphthalenedisulfonic acid, dodecyl benzenesulfonic acid, sulfonated alkyldiphenyl oxide wherein the alkyl group contains 1 to 4 carbon atoms, dodecyl (sulfophenoxy) benzenesulfonic acid, oxybis (dodecylbenzenesulfonic acid), hexadecyl (sulfophenoxy) benzenesulfonic acid, oxybis (hexadecylbenzenesulfonic acid) and mixtures thereof. Preferably the strong organic acid comprises a mixture of n-decyl (sulfophenoxy) benzenesulfonic acid and oxybis (n-decylbenzenesulfonic acid).

Examples of suitable anionic surfactants include tetrasodium N-(1,2-dicarboxyethyl)-N-octadecylsulfosuccinamate, tetrasodium N-1,2-dicarboxyethyl)-N-dodecylsulfosuccinamate, tetrasodium N-(1,2-dicarboxyethyl-N-butylsulfosuccinamate), tetrasodium N-(1,2-dicarboxyethyldicarboxyethyl)-N-amyloxypropylsulfosuccinamate, tetrasodium N-($\beta$-hydroxyethyl)-N-(sulfo-2,5-endomethylenehexahydrophthalylate) aspartate, sodium N-methyl-N-cocoyl taurate and mixtures thereof. The preferable anionic surfactant is tetrasodium N-(1,2-dicarboxyethyl)-N-octadecylsulfosuccinamate.

Typically, the salt of the strong organic acid will be present in an amount of 1 to 12 wt. %., preferably 3 to 8 wt. %., while the salt of the anionic surfactant will be present in an amount of 1 to 10 wt. %, preferably 2 to 6 wt. %.

The weak organic acid may be selected from the group consisting of citric acid (which is preferred), isomalic acid, glycolic acid, malonic acid, tartronic acid, malic acid, glyceric acid, tartaric acid, tricarballylic acid, and 1,2,3,4-butanetetracarboxylic acid. Preferably, the salt of the weak organic acid comprises potassium citrate. The salt of the weak organic acid is generally employed in an amount of 0.5 to 12 wt. %, preferably 1 to 9 wt. %.

The components of the aqueous composition should be such that they do not volatilize at the burning-in temperature, and are selected according to the nature of the substrate, radiation sensitive layer, and the purpose for which the plate is to be used. For example, in the case where a lithographic printing plate is being produced, the selected component must not only be an effective physical barrier, but it must also be such that it does not deleteriously affect the image (e.g. by dissolving it or by rendering it non-ink receptive). Further, it must be readily removable after the burning-in process without the image and non-image areas being adversely affected.

The foregoing examples of components are particularly useful in protecting lithographic printing plates from contamination occurring as a result of the burning-in process. The compositions of the present invention are easily applied to the surface of the developed plate by conventional methods, e.g. spraying, dipping, brushing, etc. and provide the desired protective shield. After burning-in has been completed, the shield can be readily removed from the plate merely by wiping the plate with water. This removal step can be effected while the plate is actually mounted on the printing press., and thus the plate need not be returned to the plate-making facility after completion of the burning-in procedure. Rinsing with water to remove the shield and desensitizing with, e.g. gum arabic, is all that is then required to make the plate ready for printing.

A pre-sensitized radiation sensitive plate comprising a metallic substrate and a radiation sensitive layer comprising an organic photosensitive compound may be processed by the steps of:

(a) image-wise exposing the plate to radiation such that there will be areas of the layer exposed to radiation and areas of the layer not exposed to radiation, said areas being of differing solubility and comprising a more-soluble area;

(b) developing the image-wise exposed layer by selectively removing the layer from the more-soluble area and revealing the substrate underlying the more-soluble area;

(c) treating the developed plate with the aqueous composition of the present invention to provide a water-soluble layer overlying the revealed substrate and the previously-exposed radiation sensitive layer not removed during the developing step;

(d) burning-in said plate, said burning-in being conducted in the presence of scum-forming contaminants; and (e) removing said water-soluble layer from the burned-in plate with water, thereby removing the scum-forming contaminants from the area of the revealed substrate of the plate.

The following examples serve to illustrate the invention; unless otherwise indicated, all percentages are by weight. Preceding the examples are the test procedures and result codes. Two separate tests were employed to evaluate the aqueous compositions. The first was to study the effect of a thick layer of the aqueous composition on the plate coating and also to determine the efficacy of the composition in cleaning-sealing the base. The second was to study the precision of cleaning-sealing around the complex patterns of a test picture. All plate evaluations were carried out with positive-working plates.

THICK LAYER AND BASE TEST

The test plate consisted of a 12.7×25.4 cm section of which about 2.5–3.8 cm were exposed. The entire plate was developed and wiped to dryness or near-dryness. The exposed area was treated with several milliliters of aqueous composition which were carefully rubbed in, allowed to momentarily stand and then buffed to near-dryness.

The large, unexposed section of the plate was treated in a manner designed to reproduce field conditions when manual correction is carried out. A wipe was soaked with the aqueous composition and the excess squeezed out. The resultant moist pad was wiped onto the large section to give a thick, uniform layer. This layer was not subsequently buffed. The plate was then allowed to air-dry. The exposed buffed area (i.e. the thin layer) had a solution coating weight of 3 to 4 $g/m^2$; the unexposed area (i.e. the thick layer) had a solution coating weight of 12 to 16 $g/m^2$.

The treated plates were subsequently baked in a laboratory oven at about 265°–270° C. for 2 minutes. After cooling, the entire plate was washed down with tap water; thereafter, the exposed section only was inked with a cloth; subsequently, only the exposed section was inked with a pad moistened with an ink-water mixture, and the plate was allowed to dry.

The treated plates were inspected visually and with a magnifier and stereo microscope (40×) before and after baking. First, the quality of the air-dried thick layer coating was examined. After baking and washing and inking, the exposed area was examined for lack of ink pick-up and the thick layer area was examined for surface alternation and coating attack or penetration.

PLATE TEST

The test plate consisted of a 20×28 cm section. About 2.5–5.0 cm were unexposed and the remainder of the plate was exposed using a gray scale and in a test picture having varied and complex texturing and details. The plate was developed and wiped to near-dryness. Thereafter, a suitable quantity of the test solution was applied and carefully rubbed in. The plate was then buffed to near-dryness and was allowed to air-dry. The coating weight of solution applied at this point was about 3.5–4.0 $g/m^2$.

The treated plate was heated in a laboratory oven at about 265°–270° C. for 2 minutes. After cooling, the plate was washed down and inked by rubbing with a pad moistened with an ink-water mixture. The plate was then examined visually and under magnification for precision and exactness in the inking of the image areas and non-inking of the base areas. In addition, the cleanliness of the base area was noted and the inking of the unexposed edge band was observed.

TEST CODES

The following test codes were employed in the examples:

| Code | | |
|---|---|---|
| | Thick Layer Air-Dried Pre-Bake Coating | |
| | Visual Observation | |
| H | Smooth coating surface | |
| S | Smooth coating, slight irregularity | |
| R | Some irregularity, streaks | |
| I | Irregular coating - streaks, gathering, breaks | |
| Z | No coating integrity or laydown whatsoever. Gathers to drops and dries to patches. | |
| | Thick Layer Area - After Pyrolysis | |
| | Visual | Stereo Microscope |
| N-IA | Smooth unchanged coating surface. | No difference in texture between treated and |

-continued anionic surfactant yields a pre-bake solution that contains the desired latitude for use in manual correction.

TABLE I

| Example | Commercial Solution Solids, wt. % | Sulfosucc. Surfactant Solids, wt. % | Thick Layer Air-Dried | Thick Layer Pyrolysis | Exposed Area | Test Picture |
|---|---|---|---|---|---|---|
| 1 | 8.8 | 0.0 | I | IA-SP | C | K |
| 2 | 8.6 | 1.0 | R | IA-P | C | K |
| 3 | 8.2 | 2.5 | S | N-IA | C | K |
| 4 | 7.5 | 5.0 | H | N-IA | C | K |
| 5 | 6.9 | 7.5 | H | N-IA | C | K |
| 6 | 6.3 | 10.0 | H | N-IA | V | * |
| 7 | 5.7 | 12.5 | H | N-IA | V | * |
| 8 | 5.0 | 15.0 | S | IA-P | V | * |
| 9 | 0.0 | 1.0 | H | N-IA | T | * |
| 10 | 0.0 | 5.0 | H | N-IA | T | * |
| 11 | 0.0 | 10.0 | S | N-IA | T | * |
| 12 | 0.0 | 15.0 | S | IA-P | T | * |
| Control | 0.0 | 0.0 | — | N-IA | T | * |

*Test Picture was not carried out in those cases where ink pick-up or toning on the base was observed.

| Code | | |
|---|---|---|
| IA | Streaking texture marked in coating. | untreated areas. Very slight difference in texture between areas. |
| IA-P | Greater streaking texture in coating. | Slight texture difference. Few small lightened areas of coating penetration. |
| IA-SP | Greater streaking textures with white patches and streaks. | Rough coating. Lightened areas of penetration. Isolated very small coating breaks or near-breaks. |

| | Exposed Area-Base Visual/Magnifier Observation |
|---|---|
| C | Clean, no ink-up |
| V | Very slight ink pick-up |
| T | Complete or partial ink pick-up ("toning") |

| | Test Picture Visual/Magnifier Observation |
|---|---|
| K | Fine details inked with precision and correctness. No inking problems. |
| P | Fine details of image picked-up or clogged with excessive ink. |
| Q | Image area picked-up massive ink. "Toning in area of image. Base away from image may be clean. |

EXAMPLES 1-12

A commercially available aqueous pre-bake composition was employed in Example 1. This composition (pH=6.9) consisted of 8.8 wt. % solids of which 1.4 wt. % was potassium citrate and the balance was a mixture of the disodium salts of dodecyl (sulfo-phenoxy) benzenesulfonic acid and oxybis (dodecylbenzene sulfonic acid). The dodecyl alkyl substituent was reported to have a branched chain structure. In Examples 2-8, varying amounts of the preferred anionic surfactant, i.e. tetrasodium N-(1,2 -dicarboxy-ethyl)-N-octadecylsulfosuccinamate, were added to the commercially available composition; In Examples 2-8, the quantity of commercial solution solids was gradually reduced, while the ratio of citrate to the mixture of disodium salts was maintained at substantially the same level as in Example 1. Examples 9-12 were carried out with only the preferred anionic surfactant. The pH of the solutions used in Examples 2-12 were adjusted to the 6.8-7.0 range. The results as shown in Table I set forth below support the conclusion that the addition of the

EXAMPLE 13

In this example, a comparison was made of the commercially available composition of Example 1 which contains the branched dodecyl sulfonate salts and an aqueous composition that contains the straight chain decyl sulfonate salts as well as the preferred sulfosuccinamate surfactant.

Using agitation, 10.76 kg of 87.1% potassium hydroxide were dissolved in 92.18 kg deionized water; thereafter, 11.34 kg citric acid monohydrate were added. Upon dissolution, 19.84 kg of a 40% solution of a mixture of n-decyl (sulfophenoxy) benzenesulfonic acid and oxybis (n-decyl benzenesulfonic acid) were added and the solution was rinsed in with portions totalling 1.36 kg deionized water. To this solution was added 24.16 kg of a 35% solution of the same anionic surfactant as employed in Examples 1-12 and the solution was rinsed in with portions totalling 0.43 kg deionized water. Finally, 50.0 kg deionized water was were added. The temperature did not rise above 60° C.; the resultant solution contained 16.2 wt. % solids and had a pH of 5.8. The results comparing this solution (referred to as Example 13) and that of the commercially available composition of Example 1 are shown in Table II set forth below.

TABLE II

| Example | Thick Layer Air-Dried | Thick Layer Pyrolysis | Exposed Area | Test Picture |
|---|---|---|---|---|
| 13 | H | N-IA | C | K |
| 1 | I | IA-SP | C | K |
| Control | — | N-IA | T | — |

The results shown in Table II again demonstrate the superiority of the formulation containing the sulfosuccinamate surfactant both in terms of film-forming properties and freedom from attack on the plate coating.

What is claimed is:

1. A method of processing a pre-sensitized radiation sensitive plate comprising a metallic substrate and a radiation sensitive layer comprising an organic photosensitive compound comprising the steps of:
   (a) image-wise exposing the plate to radiation such that there will be areas of the layer exposed to radiation and areas of the layer not exposed to radiation, said areas being of differing solubility and comprising a more-soluble area;

(b) developing the image-wise exposed layer by selectively removing the layer from the more-soluble area and revealing the substrate underlying the more-soluble area;

(c) treating the developed plate with an aqueous composition to provide a water-soluble layer overlying the revealed substrate and the previously-exposed radiation sensitive layer not removed during the developing step;

(d) burning-in said plate, said burning-in being conducted in the presence of scum-forming contaminants; and (e) removing said water-soluble layer from the burned-in plate with water, thereby removing the scum-forming contaminants from the area of the revealed substrate of the plate, said aqueous composition containing a mixture in an amount effective to prevent contamination of the plate surface by said scum-forming contaminants from said burning-in, said mixture comprising a combination of potassium or sodium salts of a strong organic acid, of an anionic surfactant and of a weak organic acid and having a potassium:sodium molar ratio being in the range of 1:1 to 15:1, wherein:

(i) the strong organic acid is selected from the group consisting of n-decyl(sulfophenoxy) benzenesulfonic acid, oxybis(n-decylbenzenesulfonic acid), a mono or di-alkyl straight or branched chain derivative of naphthalenesulfonic acid having 1 to 4 carbon atoms in the alkyl group, methylene dinaphthylenedisulfonic acid, dodecyl benzenesulfonic acid, sulfonated alkyldiphenyloxide wherein the alkyl group contains 1 to 4 carbon atoms, dodecyl(sulfophenoxy)benzenesulfonic acid, oxybis(dodecylbenzenesulfonic acid), hexadecyl(sulfophenoxy) benzenesulfonic acid, oxybis(hexadecylbenzene sulfonic acid) and mixtures thereof;

(ii) the anionic surfactant is selected from the group consisting of tetrasodium N-(1,2-dicarboxyethyl)-N-octadecylsulfosuccinamate, tetrasodium N-(1,2-dicarboxyethyl)-N-dodecylsulfosuccinamate, tetrasodium N-(1,2-dicarboxyethyl-N-butylsulfosuccinamate), tetrasodium N-(1,2-dicarboxyethyl)-N-amyloxypropylsulfosuccinamate, tetrasodium N-($\beta$-hydroxyethyl)-N-(sulfo-2,5-endomethylenehexahydrophthalylate) aspartate, sodium N-methyl-N-cocoyl taurate and mixtures thereof; and (iii) the weak organic acid is selected from the group consisting of citric acid, isomalic acid, glycolic acid, malonic acid, tartronic acid, malic acid, glyceric acid, tartaric acid, tricarballylic acid, 1,2,3,4-butanetetracarboxylic acid and mixtures thereof.

2. The method of claim 1 wherein the strong organic acid comprises a mixture of n-decyl (sulfophenoxy) benzenesulfonic acid and oxybis (n-decylbenzenesulfonic acid).

3. The method of claim 1 wherein the salt of the strong organic acid is present in an amount of 1 to 12 wt. %, based on the weight of the aqueous composition.

4. The method of claim 1 wherein the surfactant comprises tetrasodium N-(1,2-dicarboxyethyl)-N-octadecyl sulfosuccinamate.

5. The method of claim 1 wherein the anionic surfactant is present in an amount of 1 to 10 wt. %, based on the weight of the aqueous composition.

6. The method of claim 1 wherein the salt of the weak organic acid comprises potassium citrate.

7. The method of claim 1 wherein the salt of the weak organic acid is present in an amount of 0.5 to 12 wt. %, based on the weight of the aqueous composition.

8. The method of claim 1 wherein the strong organic acid and weak organic acid salts are potassium salt the anionic surfactant is a sodium salt form.

* * * * *